(12) United States Patent
Kawase et al.

(10) Patent No.: US 6,498,995 B2
(45) Date of Patent: Dec. 24, 2002

(54) METHOD FOR INSPECTING WIREHARNESS

(75) Inventors: Nobuhiro Kawase, Shizuoka (JP); Shigeo Funakoshi, Shizuoka (JP); Katsuhiko Ishihara, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 85 days.

(21) Appl. No.: 09/768,177

(22) Filed: Jan. 24, 2001

(65) Prior Publication Data

US 2001/0010030 A1 Jul. 26, 2001

(30) Foreign Application Priority Data

Jan. 25, 2000 (JP) ........................................ 2000-015762

(51) Int. Cl.[7] ............................................. G01R 31/02
(52) U.S. Cl. ........................................ 702/58; 702/118
(58) Field of Search ........................... 73/865.8; 324/51, 324/158.1, 500, 503; 364/579; 702/57, 58, 81, 82, 83, 115, 117, 118, 125, 182, 183, 185

(56) References Cited

U.S. PATENT DOCUMENTS

| | | | | |
|---|---|---|---|---|
| 3,594,635 A | * | 7/1971 | Minamii et al. | 324/51 |
| 4,959,792 A | * | 9/1990 | Sullivan | 364/579 |
| 5,066,919 A | * | 11/1991 | Klassen et al. | 324/538 |
| 5,264,796 A | * | 11/1993 | Klassen et al. | 324/503 |
| 5,852,796 A | * | 12/1998 | Stepanenko, Jr. | 702/176 |

* cited by examiner

Primary Examiner—John S. Hilten
Assistant Examiner—Douglas N Washburn
(74) Attorney, Agent, or Firm—Armstrong, Westerman & Hattori, LLP

(57) ABSTRACT

A method for inspecting a wireharness is disclosed that enables reduced inspection time. The method comprises inspecting a wireharness, including a plurality of wires and connectors for receiving terminals attached to ends of the wires, to judge wireharness quality.

9 Claims, 19 Drawing Sheets

F I G. 6

| L-TH PLACE | | ... | SECOND PLACE | | | | | | | | | FIRST PLACE | | | | | | | | | TERMINAL NUMBER |
|---|---|---|---|---|---|---|---|---|---|---|---|---|---|---|---|---|---|---|---|---|---|
| m | 2 | 1 | 9 | 8 | 7 | 6 | 5 | 4 | 3 | 2 | 1 | 9 | 8 | 7 | 6 | 5 | 4 | 3 | 2 | 1 | |
| | | | | | | | | | | | | | | | | | | | | ○ | 0001 |
| | | | | | | | | | | | | | | | | | | | ○ | | 0002 |
| | | | | | | | | | | | | | | | | | | ○ | | | 0003 |
| | | | | | | | | | | | | | | | | | ○ | | | | 0004 |
| | | | | | | | | | | | | | | | | ○ | | | | | 0005 |
| | | | | | | | | | | | | | | | ○ | | | | | | 0006 |
| | | | | | | | | | | | | | | ○ | | | | | | | 0007 |
| | | | | | | | | | | | | | ○ | | | | | | | | 0008 |
| | | | | | | | | | | | | ○ | | | | | | | | | 0009 |
| | | | | | | | | | | ○ | | | | | | | | | | | 0010 |
| | | | | | | | | | | ○ | | | | | | | | | | ○ | 0011 |
| | | | | | | | | | | | | | | | | | | | | | n |

18t 17t 16t 15t 14t 13t 12t 11t 10t 9t 8t 7t 6t 5t 4t 3t 2t 1t 0

31

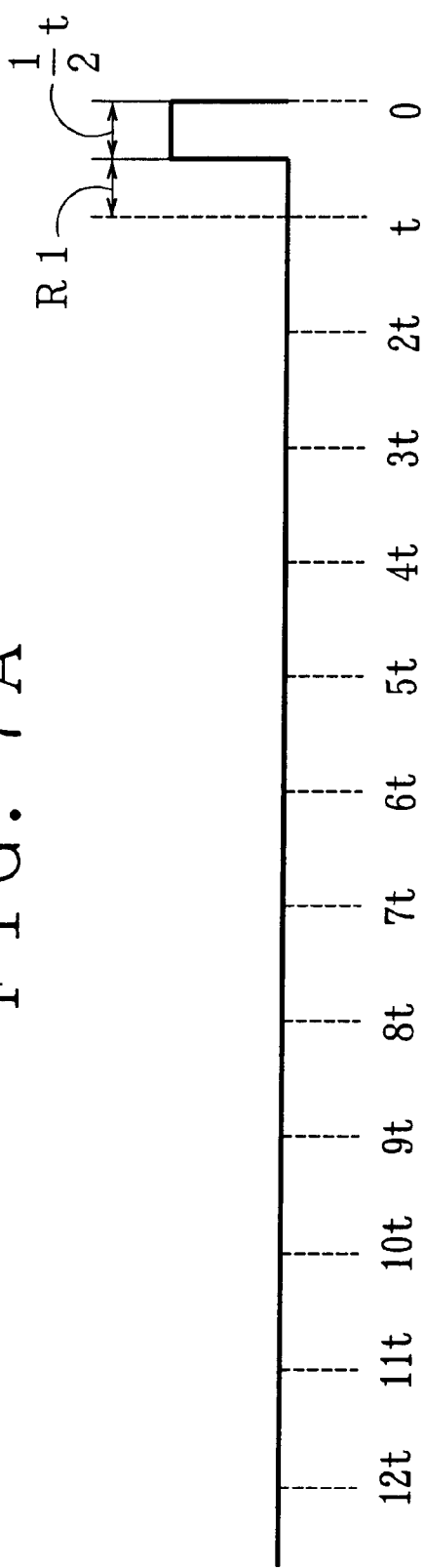
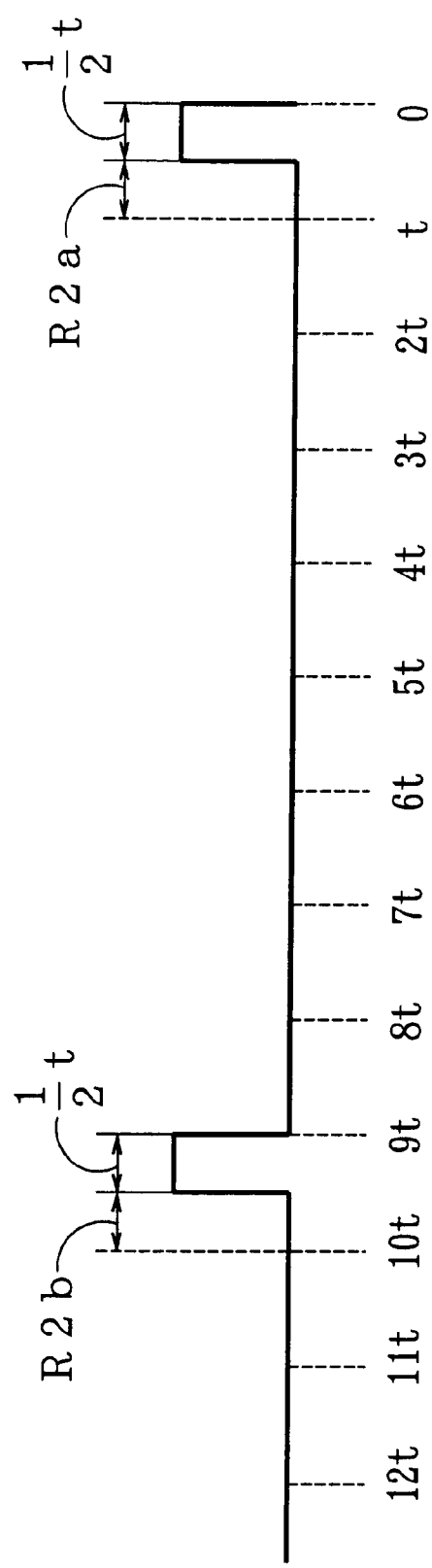
FIG. 7A
FIG. 7B

FIG. 9

| | TERMINAL NUMBER | | | | | | | | | | | | | | | | | | | | | JOINT GROUP NUMBER |
|---|---|---|---|---|---|---|---|---|---|---|---|---|---|---|---|---|---|---|---|---|---|---|
| | FIRST PLACE | | | | | | | | | SECOND PLACE | | | | | | | | | ... | L-TH PLACE | | |
| | 1 | 2 | 3 | 4 | 5 | 6 | 7 | 8 | 9 | 1 | 2 | 3 | 4 | 5 | 6 | 7 | 8 | 9 | ... | 1 | 2 ... m | |
| | ○ | ○ | | | | | | | | ○ | ○ | | | | | | | | | | | 1 |
| | ○ | ○ | | | | | | | | ○ | ○ | | | | | | | | | | | 2 |
| | ○ | ○ | | | | | | | | | | | | | | | | | | | | 3 |
| | | | ○ | ○ | ○ | ○ | | | | | | | | | | | | | | | | 4 |

| TERMINAL NUMBER | FIRST PLACE | SECOND PLACE | THIRD PLACE | FOURTH PLACE | FIFTH PLACE | SIXTH PLACE | SEVENTH PLACE | EIGHTH PLACE | ... | P-TH PLACE | JOINT GROUP NUMBER |
|---|---|---|---|---|---|---|---|---|---|---|---|
| 0001 | ○ | | | | | | | | | | 1 |
| 0002 | ○ | | ○ | | | | | | | | 1 |
| 0003 | | | ○ | | | | | | | | 4 |
| 0004 | ○ | | ○ | | | | | | | | 4 |
| 0005 | | | | | | | | | | | 1 |
| 0006 | | | | | | | | | | | 4 |
| 0007 | | | | | | | | | | | |
| 0008 | | | | | | | | | | | |
| 0009 | | | | | | | | | | | |
| 0010 | | ○ | | | | | | | | | 2 |
| 0011 | ○ | ○ | | | | | | | | | 3 |
| 0012 | | | | | | | | | | | |
| 0021 | ○ | ○ | | | | | | | | | 3 |
| 0022 | ○ | ○ | | | | | | | | | 2 |
| n | 0 | 1t | 2t | 3t | 4t | 5t | 6t | 7t | 8t | | |

| | EIGHTH PLACE | SEVENTH PLACE | SIXTH PLACE | FIFTH PLACE | FOURTH PLACE | THIRD PLACE | SECOND PLACE | FIRST PLACE | TERMINAL NUMBER | JOINT GROUP NUMBER |
|---|---|---|---|---|---|---|---|---|---|---|
| | | | | | | | | ○ | 0001 | 1 |
| | | | | | | | | | 0002 | 1 |
| | | | | | | ○ | | | 0003 | 4 |
| | | | | | | | | | 0004 | 4 |
| | | | | | | | | | 0005 | 1 |
| | | | | | | | | | 0006 | 4 |
| | | | | | | | | | 0007 | |
| | | | | | | | | | 0008 | |
| | | | | | | | | | 0009 | |
| | | | | | | | ○ | | 0010 | |
| | | | | | | | ○ | | 0011 | 2 |
| | | | | | | | | ○ | 0012 | 3 |
| | | | | | | | | | 0021 | 3 |
| | | | | | | | | | 0022 | 2 |
| | | | | | | | | | n | |
| P-TH PLACE | ... | | | | | | | | | |

| TERMINAL NUMBER | 1 | 2 | 3 | 4 | 5 | 6 | 7 | 8 | 9 | 10 | 11 | 12 | 13 | ... | 21 | 22 | ... | n |
|---|---|---|---|---|---|---|---|---|---|---|---|---|---|---|---|---|---|---|
| 0001 | O | O |   |   | O |   |   |   |   |   |   |   |   |   |   |   |   |   |
| 0002 | O | O |   |   | O |   |   |   |   |   |   |   |   |   |   |   |   |   |
| 0003 |   |   | O | O |   | O |   |   |   |   |   |   |   |   |   |   |   |   |
| 0004 |   |   | O | O |   | O |   |   |   |   |   |   |   |   |   |   |   |   |
| 0005 | O | O | O | O | O | O |   |   |   |   |   |   |   |   |   |   |   |   |
| 0006 |   |   |   |   |   |   |   |   |   |   |   |   |   |   |   |   |   |   |
| 0007 |   |   |   |   |   |   | O |   |   |   |   |   |   |   |   |   |   |   |
| 0008 |   |   |   |   |   |   |   | O |   |   |   |   |   |   |   |   |   |   |
| 0009 |   |   |   |   |   |   |   |   | O |   |   |   |   |   |   |   |   |   |
| 0010 |   |   |   |   |   |   |   |   |   | O |   |   |   |   |   |   |   |   |
| 0011 |   |   |   |   |   |   |   |   |   |   | O |   |   |   |   |   |   |   |
| 0012 |   |   |   |   |   |   |   |   |   |   |   | O |   |   |   |   |   |   |
| 0013 |   |   |   |   |   |   |   |   |   |   |   |   | O |   |   |   |   |   |
| 0021 |   |   |   |   |   |   |   |   |   |   | O |   |   |   |   |   |   |   |
| 0022 |   |   |   |   |   |   |   |   |   |   |   | O |   |   | O |   |   |   |
| n    |   |   |   |   |   |   |   |   |   |   |   |   |   |   |   |   |   | O |

| TERMINAL NUMBER | FIRST PLACE | | | | | | | | | SECOND PLACE | | | | | | | | | ... | L-TH PLACE | | |
|---|---|---|---|---|---|---|---|---|---|---|---|---|---|---|---|---|---|---|---|---|---|---|
| | 1 | 2 | 3 | 4 | 5 | 6 | 7 | 8 | 9 | 1 | 2 | 3 | 4 | 5 | 6 | 7 | 8 | 9 | ... | 1 | 2 | m |
| 0001 | ○ | ○ | | | ○ | | ○ | | | | | | | | | | | | | | | |
| 0002 | ○ | ○ | | | ○ | | ○ | | | | | | | | | | | | | | | |
| 0003 | | | ○ | ○ | | ○ | | | | | | | | | | | | | | | | |
| 0004 | | | ○ | ○ | | ○ | | | | | | | | | | | | | | | | |
| 0005 | ○ | ○ | ○ | ○ | | ○ | | | | | | | | | | | | | | | | |
| 0006 | | | | | | | ○ | ○ | | | | | | | | | | | | | | |
| 0007 | ○ | ○ | | | ○ | | ○ | | | | | | | | | | | | | | | |
| 0008 | | | | | | | | | ○ | | | | | | | | | | | | | |
| 0009 | | | | | | | | | | ○ | | | | | | | | | | | | |
| 0010 | ○ | ○ | | | | | | | | ○ | ○ | | | | | | | | | | | |
| 0011 | ○ | ○ | | | | | | | | ○ | ○ | | | | | | | | | | | |
| 0012 | | | | | | | | | | | | | | | | | | | | | | |
| 0021 | ○ | ○ | | | | | | | | ○ | ○ | | | | | | | | | | | |
| 0022 | ○ | ○ | | | | | | | | ○ | ○ | | | | | | | | | | | |
| n | | | | | | | | | | | | | | | | | | | | | | |

| | TERMINAL NUMBER | FIRST PLACE | SECOND PLACE | THIRD PLACE | FOURTH PLACE | FIFTH PLACE | SIXTH PLACE | SEVENTH PLACE | EIGHTH PLACE | ... | P-TH PLACE | JOINT GROUP NUMBER |
|---|---|---|---|---|---|---|---|---|---|---|---|---|
| | 0001 | | | | | | | | | | | 1 |
| | 0002 | ○ | | | | | | | | | | 1 |
| | 0003 | ○ | | | | | | | | | | 4 |
| | 0004 | | | ○ | | | | | | | | 4 |
| | 0005 | ○ | | ○ | | | | | | | | 1 |
| | 0006 | | | ○ | | | | | | | | 4 |
| | 0007 | | | | | | | | | | | |
| | 0008 | | | | | | | | | | | |
| | 0009 | | | | | | | | | | | |
| | 0010 | | | | | | | | | | | 2 |
| | 0011 | ○ | | | | | | | | | | |
| | 0012 | ○ | ○ | | | | | | | | | 3 |
| | 0021 | ○ | ○ | | | | | | | | | 3 |
| | 0022 | ○ | ○ | | | | | | | | | 2 |
| | n | | | | | | | | | | | |
| | | 0 | 1t | 2t | 3t | 4t | 5t | 6t | 7t | 8t | | |

| | | TERMINAL NUMBER | 0001 | 0002 | 0003 | 0004 | 0005 | 0006 | 0007 | 0008 | 0009 | 0010 | 0011 | 0012 | 0013 | 0021 | 0022 | n |
|---|---|---|---|---|---|---|---|---|---|---|---|---|---|---|---|---|---|---|
| 1 | | | ○ | ○ | | | ○ | | | | | | | | | | | |
| 2 | | | ○ | ○ | | | ○ | | | | | | | | | | | |
| 3 | | | | | ○ | ○ | | ○ | | | | | | | | | | |
| 4 | | | | | ○ | ○ | | ○ | | | | | | | | | | |
| 5 | | | ○ | ○ | | ○ | | | | | | | | | | | | |
| 6 | | | | | ○ | ○ | | ○ | | | | | | | | | | |
| 7 | | | | | | | | | ○ | | | | | | | | | |
| 8 | | | | | | | | | | ○ | | | | | | | | |
| 9 | | | | | | | | | | | ○ | | | | | | | |
| 10 | | | | | | | | | | | | ○ | | | | | | |
| 11 | | | | | | | | | | | | | ○ | | | | ○ | |
| 12 | | | | | | | | | | | | | | ○ | ▨ | | | |
| 13 | | | | | | | | | | | | | | ○ | | | | |
| ... | 21 | | | | | | | | | | | | ▨ | | | ○ | | |
| 22 | | | | | | | | ○ | | | | | | | | ○ | | |
| n | | | | | | | | | | | | | | | | | | ○ |

METHOD FOR INSPECTING WIREHARNESS

BACKGROUND OF THE INVENTION (1) Field of the Invention

This invention relates to a method for inspecting a wireharness to judge the quality thereof and, more specifically, to a method for inspecting a wireharness to judge the quality thereof by checking whether each terminal of connectors connected to each both ends of wires, which constitute the wireharness, electrically continues to other terminals or not.

(2) Description of the Related Art

So far, a wireharness, which includes a plurality of wires and connectors for receiving terminals attached to ends of the wires, has been judged its quality by checking whether said each terminal electrically continues to other terminals or not.

The conventional inspection of a wireharness described above has been carried out according to the following processes. That is, one terminal is selected out of terminals of the wireharness, then a potential is applied to this selected terminal and then, an electric potential at other terminals are checked. Thus, all the terminals are subjected to be applied potential in turn, then the potential of all the terminals except the terminal, to which the potential is applied, is checked in turn, thereby checking the electrical continuity between every pair of terminals.

A condition on the electrical continuity among terminals of a wireharness, which is subjected to be checked, is compared to that of a normal wireharness, thereby the quality of the wireharness, which is subjected to be checked, is judged and abnormal portions of the wireharness are detected.

In the above conventional art, all the terminals are subjected to be applied potential in turn, then the potential of all the terminals except the terminal, to which the potential is applied, is checked in turn. Since it has been needed to apply a potential to the terminals repeatedly for (number of the terminals −1) times, there has been a problem that a long period of time is required to finish the inspection when the number of wires in the wireharness increases and the number of the terminals is increased.

That is, supposing that one terminal in the wireharness is applied potential, that a period of time T is required to finish the measurement of the potential at all the terminals except said one terminal, and that the number of the terminals is 3000, then as a result, a period of time 3000T is required to complete all the measurement of the potential between every pair out of the 3000 terminals.

SUMMARY OF THE INVENTION

It is therefore an objective of the present invention to solve the above problem and to provide a method for inspecting a wireharness, in which a period of time required to complete the inspection can be shortened.

In order to attain the above objective, the present invention is to provide a method for inspecting a wireharness 2 including a plurality of wires 4 and connectors 5 for receiving terminals attached to ends of the wires in order to judge the quality of the wireharness, and the method for inspecting the wireharness comprises a first inspection step S1 consisting of:

simultaneously inputting a mutually different input 31 to said each terminal; and judging the quality of the wireharness by comparing an output 41 from said each terminal upon inputting of said input with a standard output from each terminal of a normal wireharness upon inputting of said input.

According to the construction described above, since the input is simultaneously input to each terminal, therefore a period of time required to inspect the wireharness can be controlled.

Moreover, since the mutually different input is simultaneously input to each terminal, therefore a period of time required for inputting the input does not fluctuate, because said time does not depend upon the number of joint groups (described later) constituted with wires by their mutual connection, which constitute the wireharness.

Said each terminal is numbered in sequence starting from one and said input 31 is input to said each terminal with time intervals corresponding to said number.

According to the construction described above, the input is securely mutually different for each terminal and can be simultaneously input to each terminal more securely, therefore a period of time required to inspect the wireharness can be controlled more securely.

Said input is input to said terminals in sequence starting from the terminal having less number of place up to the terminal having larger number of place, while with respect to each place said input is input to said terminals with the timing corresponding to the number of said place.

According to the construction described above, the input is mutually different for each terminal more securely and can be simultaneously input to each terminal more securely.

Moreover, a period of time to complete the input to all the terminals can be shortened compared to a method, in which the input is input to each terminal in turn.

The wireharness 2 has joint groups JG1, JG2, JG3 and JG4, each joint group having the wires 4 mutually electrically connected and terminals connected to ends of the wires, and the method for inspecting a wireharness comprises a second inspection step S2 consisting of:

simultaneously inputting a second input 35, which is mutually different among the different joint groups but is identical within said each joint group, to said each terminal; and judging the quality of the wireharness by comparing a second output 42 from said each terminal after inputting of said second input with a second standard output from each terminal of a normal wireharness upon inputting of said second input.

According to the construction described above, it can be securely inspected whether a short circuit among the joint groups exists or not.

The wireharness 2 has joint groups JG1, JG2, JG3 and JG4, each joint group having the wires 4 mutually electrically connected and terminals connected to ends of the wires, and the method for inspecting a wireharness comprises a third inspection step S3 consisting of:

simultaneously inputting a third input 36, which is mutually different among the different joint groups, to any one of terminal out of the terminals constituting the respective joint group; and judging the quality of the wireharness by comparing a third output 43 from said each terminal after inputting of said third input with a third standard output from each terminal of a normal wireharness upon inputting of said third input.

According to the construction described above, it can be securely inspected whether an open circuit among the terminals within each joint group exists or not.

The present invention is also to provide a method for inspecting a wireharness 2 which includes a plurality of wires 4 and connectors 5 for receiving terminals attached to ends of the wires in order to judge the quality of the wireharness, wherein the wireharness has joint groups JG1, JG2, JG3 and JG4, each joint group having the wires mutually electrically connected and terminals connected to ends of the wires, and the method for inspecting the wireharness comprises a second inspection step S2 and a third inspection step S3, said second inspection step S2 comprising the steps of:
  simultaneously inputting a second input 35, which is mutually different among the different joint groups but is identical within said each joint group, to said each terminal; and
  judging the quality of the wireharness by comparing a second output 42 from said each terminal after inputting of said second input with a second standard output from each terminal of a normal wireharness upon inputting of said second input, said third inspection step S3 comprising the steps of:
  simultaneously inputting a third input 36, which is mutually different among the different joint groups, to any one of terminal out of the terminals constituting the respective joint group; and
  judging the quality of the wireharness by comparing a third output 43 from said each terminal after inputting of said third input with a third standard output from each terminal of a normal wireharness upon inputting of said third input.

According to the construction described above, it can be securely inspected whether a short circuit among the joint groups exists or not, and moreover, it can be securely inspected whether an open circuit among the terminals within each joint group exists or not.

Said each joint group is numbered in sequence starting from one and said second input 35 is input to said each terminal with the timing corresponding to the number of said each joint group.

According to the construction described above, the second input is secrely mutually different for each joint group, therefore the second input can be simultaneously input to each terminal more securely.

Said each joint group is numbered in sequence starting from one and said third input 36 is input to said each terminal with the timing corresponding to the number of said each joint group.

According to the construction described above, the third input is secrely mutually different for each joint group, therefore the third input can be simultaneously input to each terminal more securely.

When the wireharness 2 is judged to have abnormality on the basis of an output from at least one terminal in any one step out of the first to third inspection steps, i.e. S1 to S3, the method for inspecting the wireharness comprises a fourth inspection step S4 consisting of:
  successively selecting one terminal out of said terminals being judged to have abnormality;
  inputting a fourth input 32 to said selected terminal; and
  judging the quality of the wireharness by comparing fourth outputs 44a, 44b and 44c from all terminals except said selected terminal with fourth standard outputs from all terminals except said selected terminal upon inputting of said fourth input 32 to said selected terminal of a normal wireharness.

According to the construction described above, a short circuit or an open circuit of a terminal, which is judged to have the abnormality, can be securely inspected.

BRIEF DESCRIPTION OF THE DRAWINGS

FIG. 6 illustrates an input data map, which is memorized by a memory section of the wireharness inspection device according to the embodiment;

FIG. 7A illustrates a timing for applying a potential to a (0001) terminal in the input data map shown in FIG. 6;

FIG. 7B illustrates a timing for applying a potential to a (0011) terminal in the input data map shown in FIG. 6;

FIG. 9 illustrates a joint group map, which is memorized by a memory section of the wireharness inspection device according to the embodiment;

FIG. 10 illustrates a standard map, which is memorized by a memory section of the wireharness inspection device according to the embodiment;

FIG. 11 illustrates a joint data map, which is memorized by a memory section of the wireharness inspection device according to the embodiment;

FIG. 12 illustrates an open circuit inputting data map, which is memorized by a memory section of the wireharness inspection device according to the embodiment;

FIG. 14 illustrates a normal output data map, which is memorized by a memory section of the wireharness inspection device according to the embodiment;

FIG. 15 illustrates an example of an output data map obtained by the matrix inspection steps shown in FIG. 3;

FIG. 16 illustrates an example of a fourth output data map obtained in an inspection step for all elements in a wireharness inspection method shown in FIG. 2;

FIG. 17 illustrates an example of the second output data map obtained in a short circuit inspection step shown in FIG. 4;

FIG. 20 illustrates a further other example of the fourth output data map obtained in an inspection step for all elements in a wireharness inspection method shown in FIG. 2.

DESCRIPTION OF THE PREFERRED EMBODIMENTS

In the following, a preferred embodiment of the present invention will be explained with reference to FIGS. 1 to 20.

Figure 1:
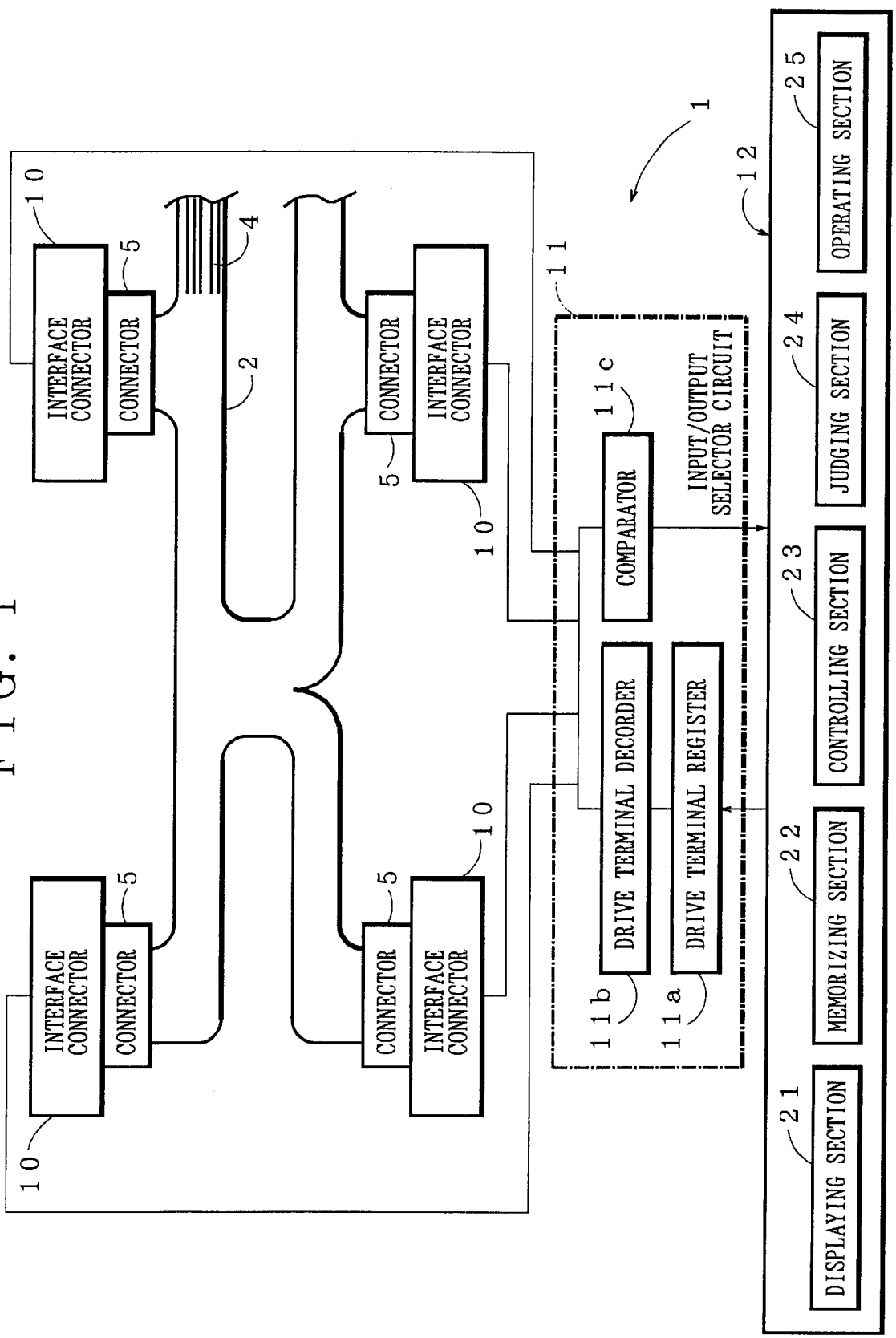
FIG. 1 illustrates a basic constitution of a wireharness inspection device according to an embodiment of the present invention.

A wireharness inspection device 1 shown in FIG. 1 is disposed downstream in a manufacturing line of the wireharness 2 to check a short circuit or an open circuit in the wireharness 2 manufactured and to indicate portions of the short circuit or the open circuit to an operator, if any, thereby supporting the operator to correct the wireharness 1.

The wireharness 2, which is inspected by the wireharness inspecting device 1 shown in FIG. 1 includes many wires 4 and a plurality of connectors 5 for receiving terminals (not shown in the figure) attached to the ends of the wires 4. The wires 4 mutually are connected or not connected electrically according to a pattern required at positions where the wireharness 2 is mounted in a vehicle and the like as a movable object.

In this specification, each terminal of the connectors 5 is numbered starting from 0001 up to n as shown in FIGS. 6 and 10 to 20. Thus, each terminal is mutually differently numbered by an integer in sequence starting from 0001. In this specification, each terminal is called "n" terminal, wherein this n is the number of each terminal.

The wireharness 2 has a plurality of joint groups constituted by a plurality of wires 4 electrically connected with each other and terminals connected to ends of these wires 4. In this specification, these joint groups (JGs) are numbered in sequence starting from JG1. Thus, each joint group is mutually differently numbered by an integer in sequence starting from JG1.

Figure 8A:

As an example, the wireharness 2 has joint groups JG1, JG2, JG3 and JG4 as shown in FIGS. 8A to 8D. The joint group JG1 is constituted by "0001" terminal, "0002" terminal, "0005" terminal and wires 4 electrically connected to these terminals as shown in FIG. 8A.

Figures 5, 8B, 8C:
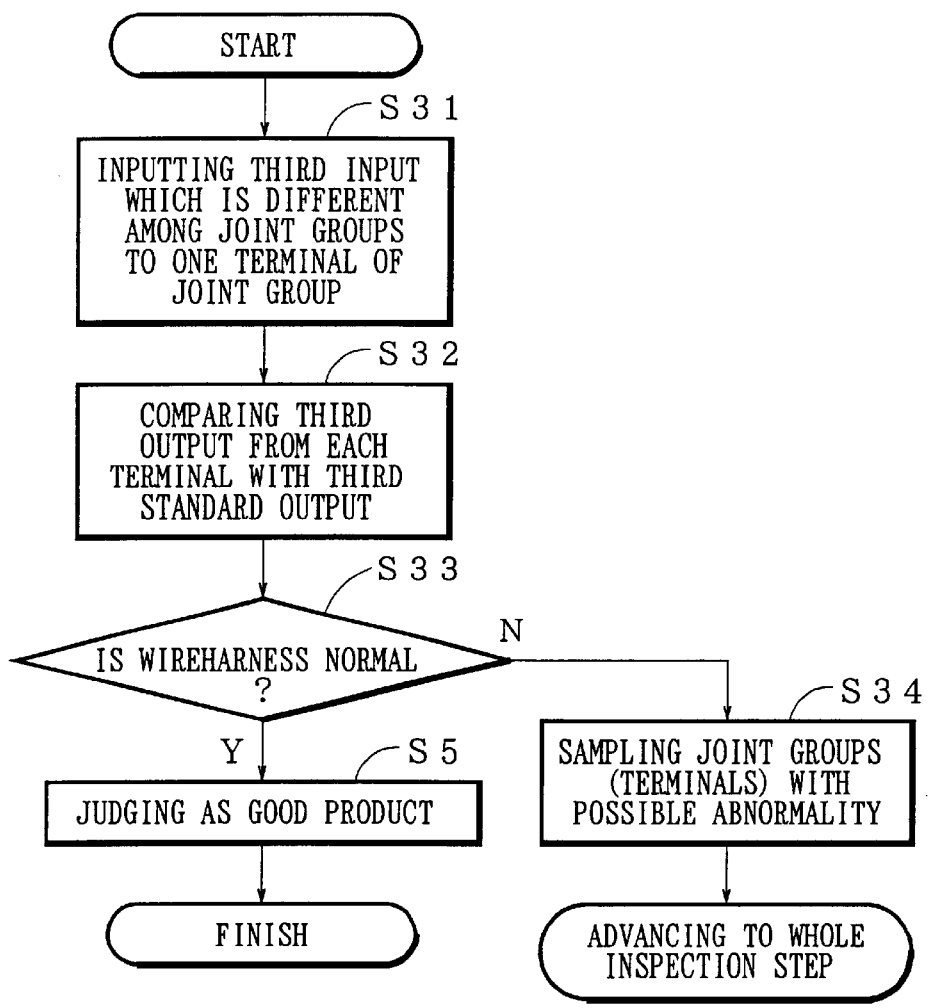
FIG. 5 is a flowchart illustrating open circuit inspection steps in a method for inspecting the wireharness shown in FIG. 2.
FIGS. 8A to 8D illustrate a constitution of a joint group of the wireharness inspected by the wireharness inspection device of FIG. 1.
Figure 8D:
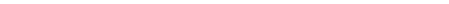

The joint group JG2 is constituted by "0011" terminal, "0022" terminal and wire 4 electrically connected to these terminals as shown in FIG. 8B. The joint group JG3 is constituted by "0012" terminal, "0021" terminal and wire 4 electrically connected to these terminals as shown in FIG. 8C. The joint group JG4 is constituted by "0003" terminal, "0004" terminal, "0006" terminal and wires 4 electrically connected to these terminals as shown in FIG. 8D.

As shown in FIG. 1, the wireharness inspecting device 1 has a plurality of interface connectors 10, an input/output selector circuit 11 and a control device 12. Each interface connector 10 is connectable to the connector 5 of the wireharness 2. Each interface connector 10 has receiving terminals (not shown in the figure) for connecting to respective terminals of the connector 5 when each interface connector 10 connects with respective connector 5. Each receiving terminal of the interface connector 10 connects to the input/output selector circuit 11.

The input/output selector circuit 11, constituted by a microcomputer (CPU) of the control device 12 and so on, drives the receiving terminals of the interface connector 10 at about the same time according to data successively outputted by a control section 23 (explained later), which acts in accordance with a predetermined control program. That is, the input/output selector circuit 11 outputs to terminals of the connector 5 through the interface connector 10.

The input/output selector circuit 11 judges whether a potential of each receiving terminal is higher or lower than a standard potential for every receiving terminal, then makes the control device 12 successively take its result of the judgment in. That is, the input/output selector circuit 11 judges whether a potential of each terminal of the connector 5 is higher or lower than the standard potential through the interface connector 10, then makes the control device 12 take the result of the judgment in.

As shown in FIG. 1, the input/output selector circuit 11 concretely comprises a driving terminal register 11a for tentatively preserving data successively outputted from the control device 12, a driving terminal decoder 11b having a driver (not shown in the figure), which decodes the data preserved by the driving terminal register 11a and outputs to the receiving terminals of the interface connector, and a comparator 11c, which successively compares a potential of each receiving terminal in its outputted state with the standard potential and outputs either H or L level signal according to a result of the comparison. The driving terminal register 11a and the driving terminal decoder 11b are inputting means described in this specification. The comparator 11c is outputting means described in this specification.

The control device 12 is a computer including known RAM, ROM, CPU and so on, which is connected to the input/output selector circuit 11 and the interface connectors 10 and controls the operation thereof, thereby controlling the whole wireharness inspection device 1.

The control device 12 comprises a displaying section 21 as displaying means, a memorizing section 22 as memorizing means, a controlling section 23 as controlling means, a judging section 24 as judging means and an operating section 25 as operating means. The displaying 21 has functions to display various setting conditions of the inspection device 1, results (explained later) that the judging section 24 judges the quality of the wireharness 2, and fault positions such as short circuit and disconnection when the judging section 24 judges that the wireharness 2 has an abnormality.

Figure 13:
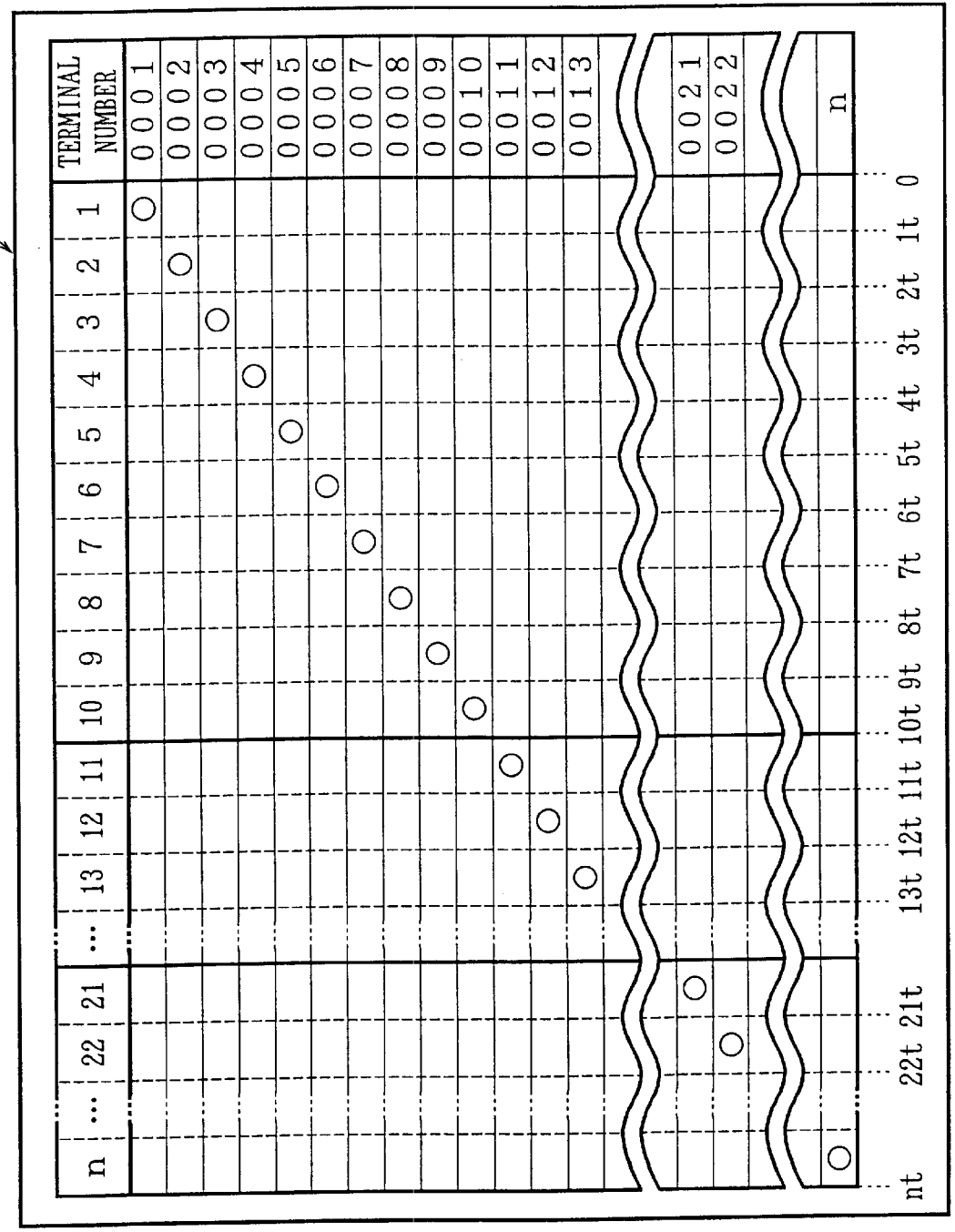
FIG. 13 illustrates a second input data map, which is memorized by a memory section of the wireharness inspection device according to the embodiment.

The memorizing section 22 memorizes control programs for controlling the operation of the controlling section 23, normal connection data as normal connecting informations indicating normal connecting conditions of the wireharness 2 as an object for comparison upon inspection, an input data map 31 which is the input in this specification and shown in FIG. 6, and a second input data map 32 which is a fourth input in this specification and shown in FIG. 13.

The input data map 31 shown in FIG. 6 indicates timing of inputting to each terminal. That is, indicating timing of inputting a signal to each terminal. The input data map 31 is a map, in which the input is carried out with timing in accordance with a number that has a small place out of each terminal number and then, the input is successively carried out with timing in accordance with a number that has larger place out of each terminal number.

Concretely, the terminal number is shown by using the decimal notation and the inputting is successively carried out with timing in accordance with a number of each place, starting with the place of units (shown as the first place in the figure), then the place of tens (shown as the second place in the figure) and then, the L-th place and so on. Furthermore, in each place, the inputting is carried out with timing in accordance with a number of each place successively starting with 1 up to 9. An interval of the timing for the inputting is set to be a predetermined interval of time t. The terminal number may be shown by using another system such as the octal notation and the hexadecimal notation, instead of the decimal notation.

More concretely, to the "0001" terminal, the inputting is carried out in a period of time from a start of the inspection up to a lapse of time t after the start of the inspection, while to the "0002" terminal, the inputting is carried out in a period of time from a lapse of time t after the start of the inspection up to a lapse of time 2t after the start of the inspection, then the timing of the inputting is gradually delayed as the number increases.

Then, to the "0011" terminal, the inputting is carried out in a period of time from the start of the inspection up to a lapse of time t after the start of the inspection and also in a period of time from a lapse of time 9t after the start of the inspection up to a lapse of time 10t after the start of the inspection. As shown in FIG. 6, each inputting is carried out with the timing indicated by a respective white circle, which is shown in the input data map 31.

A second input data map 32 shown in FIG. 13 indicates the timing of inputting to each terminal. In the second input data map 32, one terminal out of the terminals is selected in turn and then, said terminal is input in turn. Concretely, the second input data map 32 is a map, in which the input is carried out to a terminal with the time interval t starting with a terminal having less number in turn.

Figure 10:
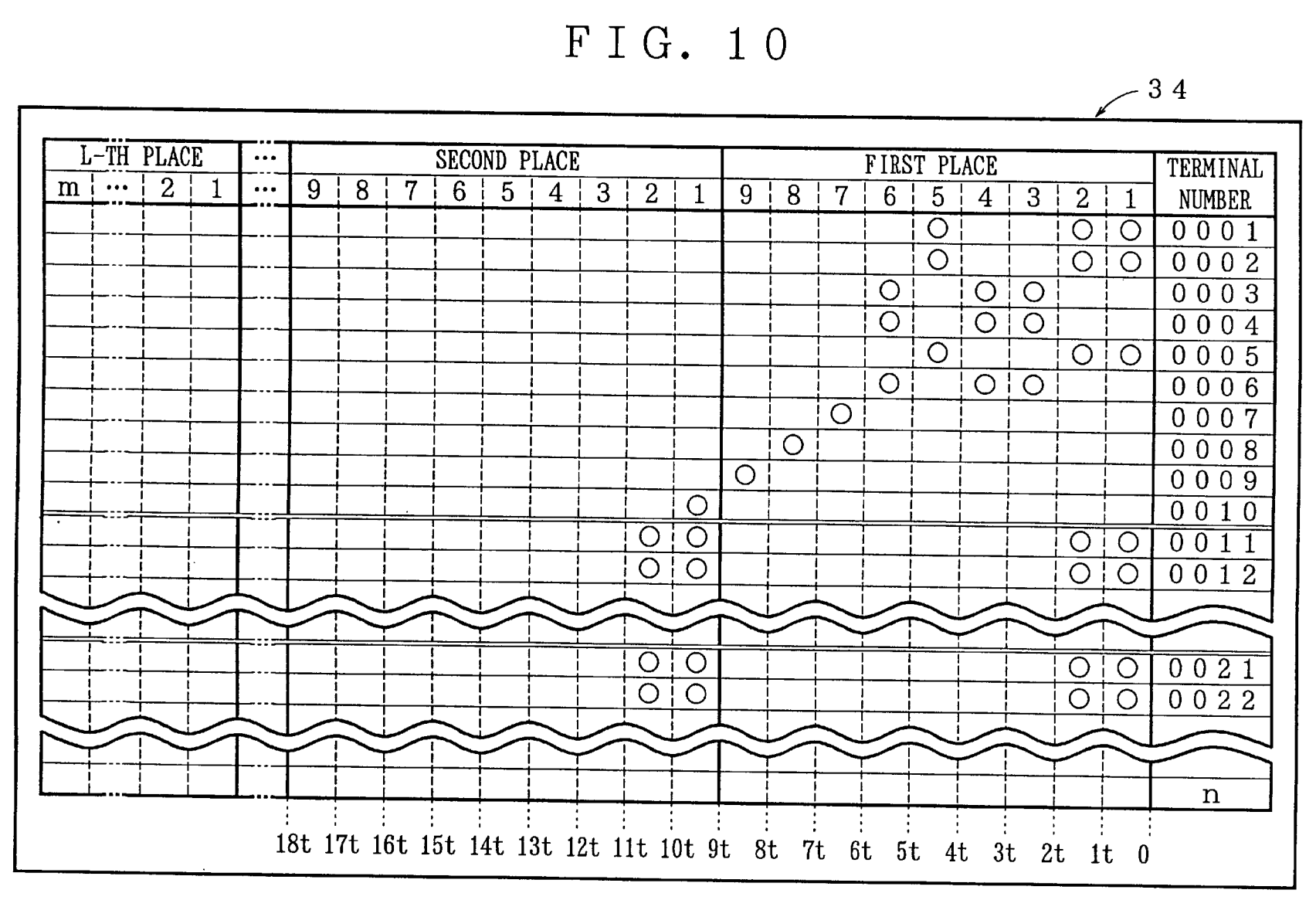

The memorizing section 22 at least tentatively memorizes a joint group map 33 shown in FIG. 9, a standard map 34 shown in FIG. 10 as the standard information described in this specification and, a joint data map 35 shown in FIG. 11, an open circuit inputting data map 36 shown in FIG. 12 as a third input information described in this specification, and a normal output data map 37 shown in FIG. 14 as a fourth standard information described in this specification.

The joint group map 33 shown in FIG. 9 is formed by the controlling section 23 and the like on the basis of the normal connection data. The joint group map 33 shows the terminal numbers, which constitute each joint group.

The terminal number is shown by using the decimal notation similarly to the input data map 31 shown in FIG. 6, showing from less terminal number up to larger number in turn, that is starting with the place of units (shown as the first place in the figure), then the place of tens (shown as the second place in the figure) and then, the L-th place and so on. When the input data map 31 shows the terminal number by the octal notation or the hexadecimal notation, the joint group map 33 preferably shows the terminal number by the octal notation or the hexadecimal notation in response to the input data map 31. That is, the joint group map 33 shown in FIG. 9 preferably shows the terminal number by using the same system with that used in the input data map 31 shown in FIG. 6.

For example, in this preferred embodiment, the "0011" terminal is indicated by numeral 1 at the first place and numeral 1 at the second place, while the "0022" terminal is indicated by numeral 2 at the first place and numeral 2 at the second place. Thus, the joint group map 33 shows the terminal number, which constitutes each joint group, by white circles in the figure.

The standard map 34 shown in FIG. 10 is formed by the controlling section 23 and the like on the basis of the input data map 31 and the joint group map 33. When the wireharness 2 is normal, the standard map 34 shows the timing that the potential of each terminal becomes high potential when the inputting to each terminal is carried out in accordance with the input data map 31. That is, the standard map 34 constitutes informations outputted from each terminal when the wireharness 2 is normal.

In the standard map 34, the terminal number is shown by using the decimal notation similarly to the input data map 31 shown in FIG. 6 and the inputting is successively carried out with timing in accordance with the number of each place, starting with the place of units (shown as the first place in the figure), then the place of tens (shown as the second place in the figure) and then, the L-th place and so on. The standard map 34 preferably shows the terminal number by using the same system with that used in the input data map 31.

Furthermore, in each place, the inputting is carried out with timing in accordance with a number of each place successively starting with 1 up to 9. Each interval of the timing for the inputting is set to be the predetermined interval of time t.

More concretely, the "0002" terminal and the "0005" terminal are connected to the "0001" terminal, therefore the "0001" terminal is input, i.e. raised its potential with the timing, that is, for a period of time from the start of the inspection up to a lapse of time t after the start of the inspection, a period of time from a lapse of time t after the start of the inspection up to a lapse of time 2t after the start of the inspection, and a period of time from a lapse of time 4t after the start of the inspection up to a lapse of time 5t after the start of the inspection.

In addition, since the "0011" terminal is connected to the "0022" terminal, the "0011" terminal is input, i.e. raised its potential with the timing, that is, for a period of time from the start of the inspection up to a lapse of time t after the start of the inspection, a period of time from a lapse of time t after the start of the inspection up to a lapse of time 2t after the start of the inspection, a period of time from a lapse of time 9t after the start of the inspection up to a lapse of time 10t after the start of the inspection, and a period of time from a lapse of time 10t after the start of the inspection up to a lapse of time 1lt after the start of the inspection. The outputting is carried out from each terminal with the timing shown by white circles in FIG. 10.

A joint data map 35 shown in FIG. 11 shows that a signal is input or output with the same timing to the terminals, which are different for each joint group and constitute the identical joint group. The joint data map 35 shows the timing, at which an input is input to the terminals constituting each joint group with the timing according to the joint group number or at which the terminals constituting each joint group have high potential.

Concretely, the joint group number is shown by using the binary notation, and the inputting is successively carried out or the high potential is applied to the terminals with timing in accordance with a numeral of the joint group number, starting with the place of units (shown as the first place in the figure), then the place of tens (shown as the second place in the figure) and then, the P-th place and so on. Each interval of the timing is set to be the predetermined interval of time t.

For example, the inputting is performed or the high potential is applied to, in other words, inputting or outputting is performed, to the "0001" terminal, "0002" terminal and "0005" terminal, which constitute the joint group JG1, in a period of time from the start of the inspection up to a lapse of time t after the start of the inspection. The inputting is performed or the high potential is applied to, in other words, inputting or outputting is performed, to the "0012" terminal and "0021" terminal, which constitute the joint group JG3, in a period of time from the start of the inspection up to a lapse of time t after the start of the inspection and in a period of time from a lapse of time t after the start of the inspection up to a lapse of time 2t after the start of the inspection.

The inputting is performed or the high potential is applied to, in other words, inputting or outputting is performed, to the "0003" terminal, "0004" terminal and "0006" terminal, which constitute the joint group JG4, in a period of time from a lapse of time 2t after the start of the inspection up to a lapse of time 3t after the start of the inspection. Thus, the inputting is performed or the high potential is applied to each terminal with the timing shown by white circles in FIG. 11.

The joint data map 35 composes the second input, the second standard output and the third standard output, which are described in the present specification.

An open circuit inputting data map 36 shown in FIG. 12 shows the timing when a signal is input to one terminal out of the terminals, which are different among the joint group and constitute the same joint group.

The open circuit inputting data map 36 shows the timing, at which a signal is input to one terminal out of the terminals constituting each joint group with the timing according to the joint group number.

Concretely, similarly to the joint data map 35 shown in FIG. 11, the joint group number is shown by using the binary notation, and the inputting is successively carried out to a terminal, which has the least terminal number out of terminals constituting each joint group, with timing in accordance with a numeral of the joint group number, starting with the place of units (shown as the first place in the figure), then the place of tens (shown as the second place in the figure) and then, the P-th place and so on. Each interval of the timing is set to be the predetermined interval of time t.

For example, the inputting is carried out to the "0001" terminal out of the terminals constituting the joint group JG1 in a period of time from the start of the inspection up to a lapse of time t after the start of the inspection. The inputting is carried out to the "0012" terminal out of the terminals constituting the joint group JG3 in a period of time from the start of the inspection up to a lapse of time t after the start of the inspection and in a period of time from a lapse of time t after the start of the inspection up to a lapse of time 2t after the start of the inspection.

The inputting is performed to the "0003" terminal out of the terminals constituting the joint group JG4, in a period of time from a lapse of time 2t after the start of the inspection up to a lapse of time 3t after the start of the inspection. Thus, the inputting is performed to each terminal with the timing shown by white circles in FIG. 12.

A normal output data map 37 shown in FIG. 14 is made by the controlling section 23 on the basis of the normal connection data and shows the timing at which the potential of each terminal of a normal wireharness 2 becomes high when the inputting is carried out to each terminal with the timing based on the second inputting data map 32. The normal output data map 37 shows the rise and fall in the potential of each terminal with every said time interval t. In an example shown in FIG. 14, the timing of raising the potential is shown by white circles, while the timing, at which the potential is low, is shown by blank spaces.

The memorizing section 22 has a function to tentatively memorize data whether the potential of each terminal is higher or lower than the standard potential, which is judged by the comparator, when the inputting is carried out to each terminal with the timing based on the maps 31, 32, 35 and 36.

For example, when the input is carried out to each terminal on the basis of the input data map 31, the memorizing section 22 tentatively memorizes an output data map 41 shown in FIG. 15 as an output information described in the present specification from each terminal, which has the same form with that of the input data map 31.

When the input is carried out to each terminal on the basis of the joint data map 33, the memorizing section 22 tentatively memorizes a second output data map 42 shown in FIG. 17 and so on as a second output information described in the present specification from each terminal, which has the same form with that of the joint data map 35.

Figure 19:
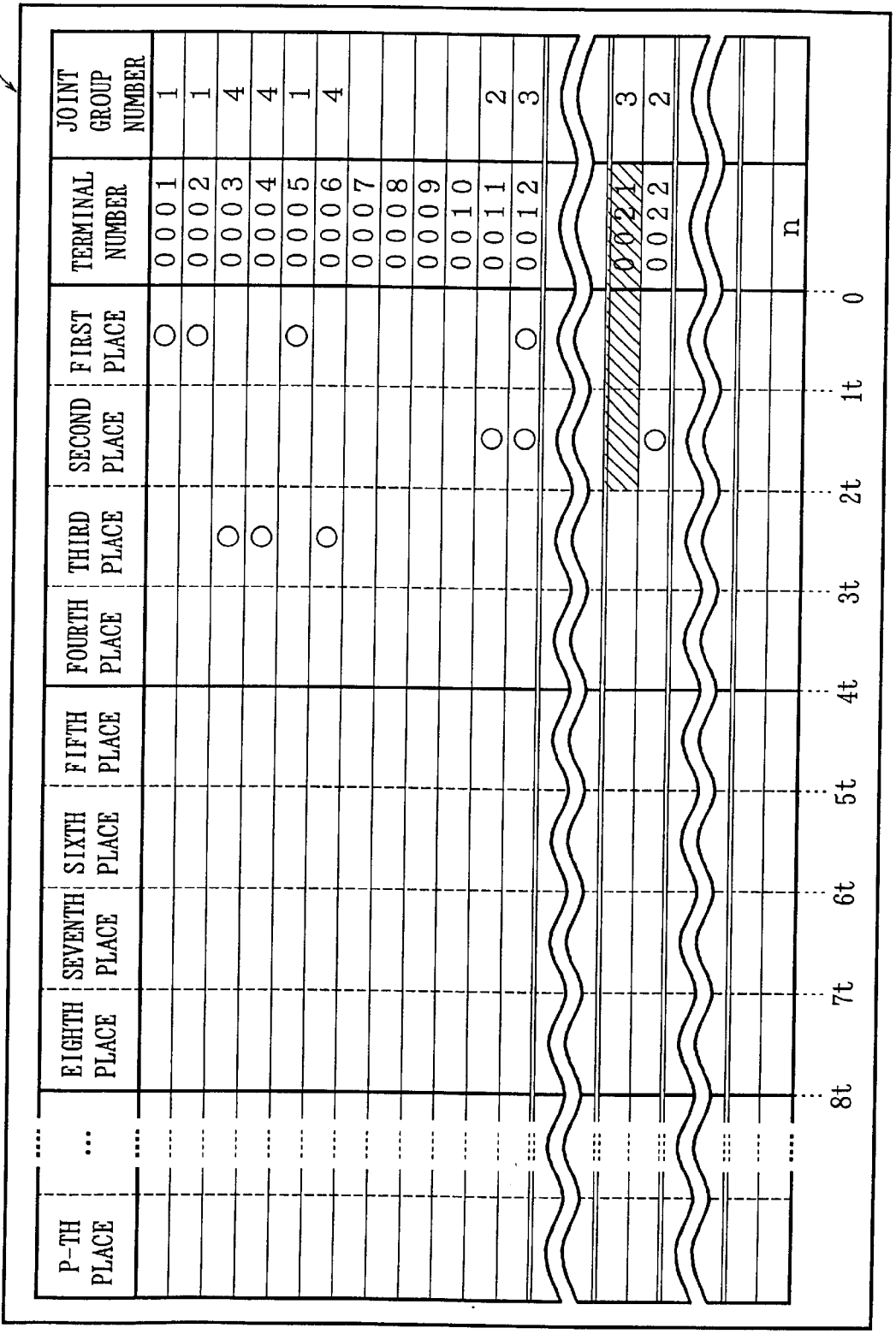
FIG. 19 illustrates an example of a third output data map obtained in an open circuit inspection step shown in FIG. 5.

When the input is carried out to each terminal on the basis of an open circuit input data map 36, the memorizing section 22 tentatively memorizes a third output data map 43 shown in FIG. 19 and so on as a third output information described in the present specification from each terminal, which has the same form with that of the joint data map 35.

Figure 16:
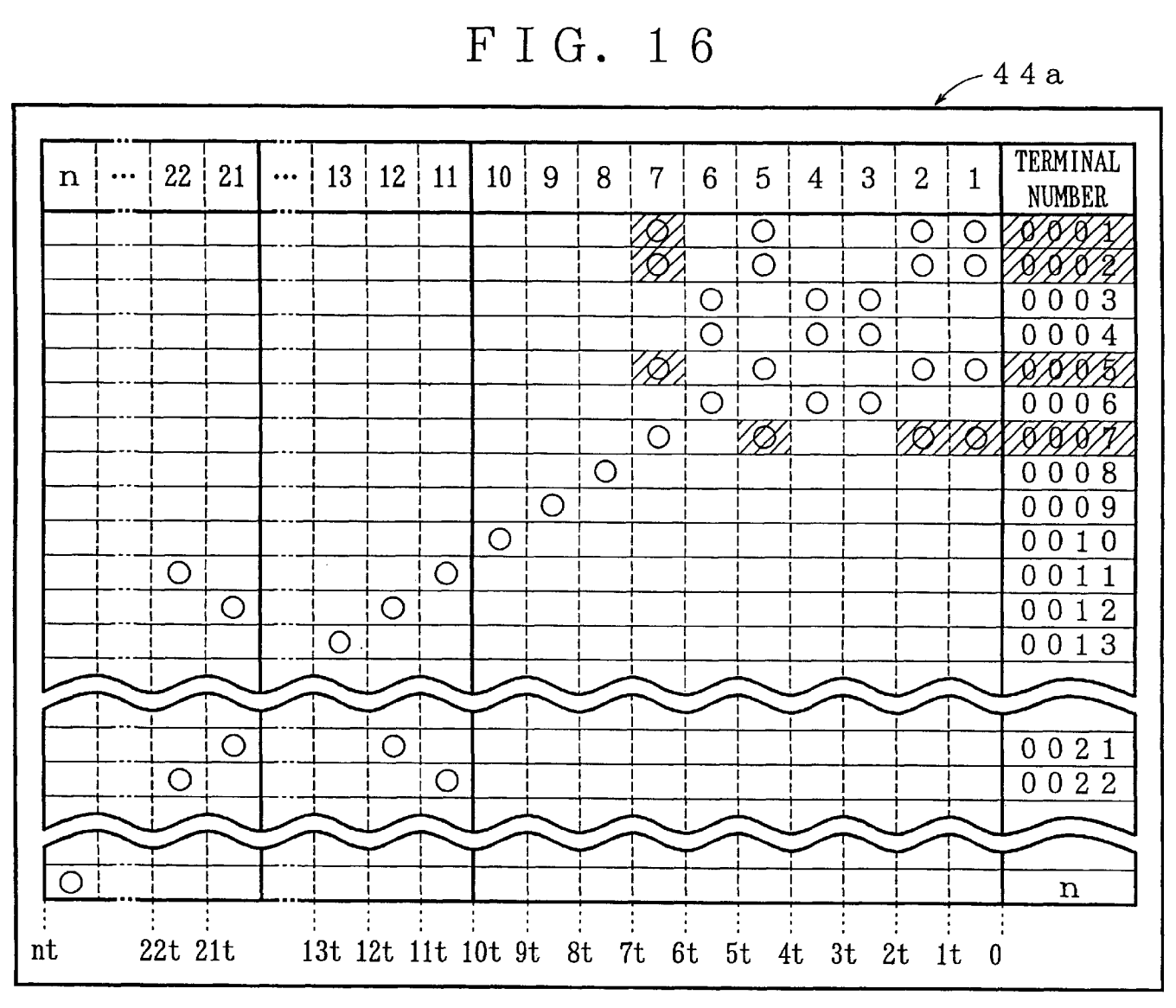
Figure 18:
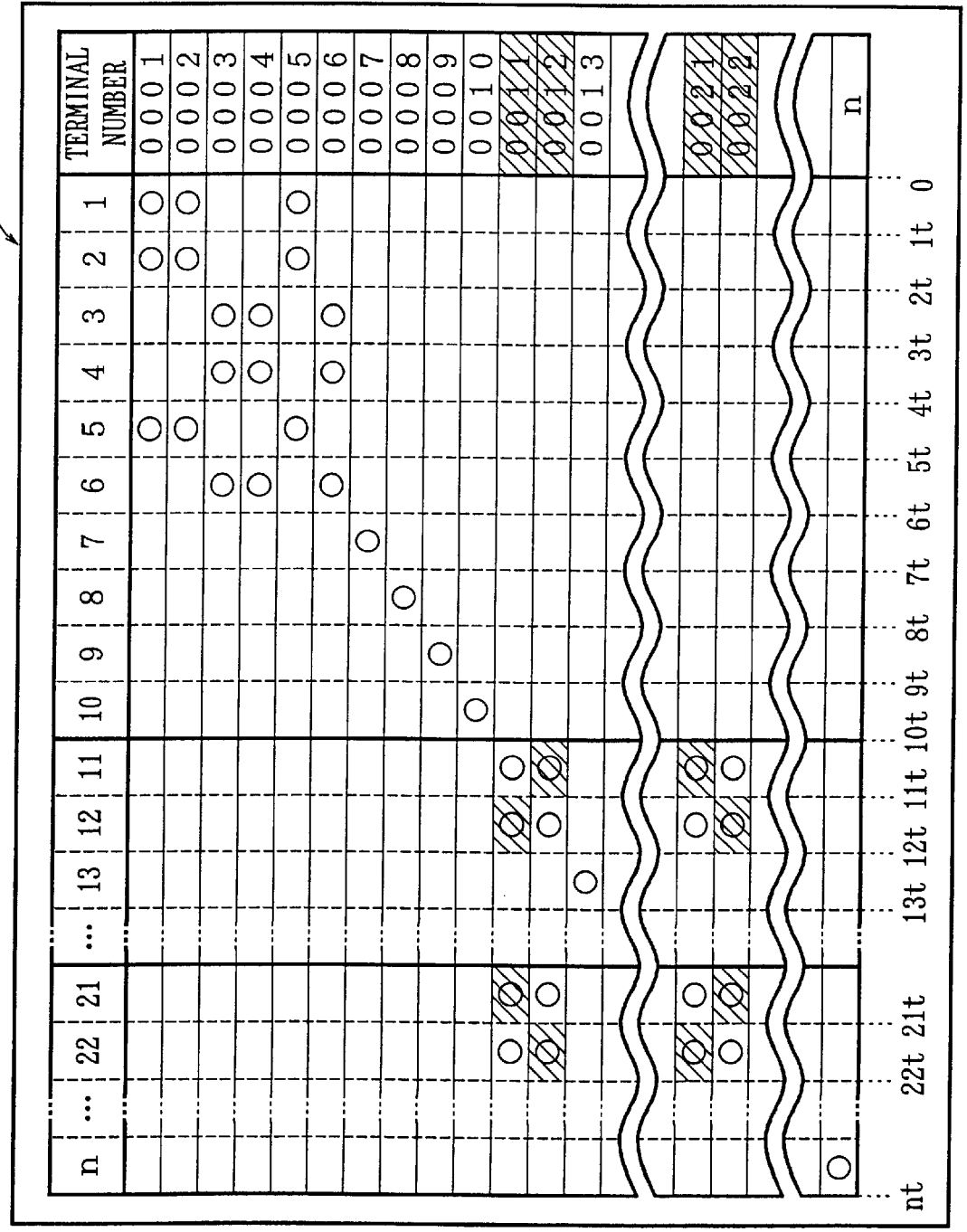
FIG. 18 illustrates another example of a fourth output data map obtained in an inspection step for all elements in a wireharness inspection method shown in FIG. 2.

When the input is carried out to each terminal on the basis of the second input data map 32, the memorizing section 22 tentatively memorizes fourth output data maps 44a, 44b and 44c shown in FIGS. 16, 18 and 20 as a fourth output information described in the present specification from each terminal, which has the same form with that of the second input data map 32.

These output data maps 44a, 44b and 44c show whether the potential of each terminal is high or low with every said time interval t, similarly to the input data map 31 and so on. In the examples shown in FIGS. 16, 18 and 20, the timing when the potential of each terminal is higher than the standard potential is shown by white circles, while the timing when the potential is lower than the standard potential is shown by blank spaces.

The controlling section 23 is operated according to a control program memorized by the memorizing section 22. The controlling section 23 inputs an input to each terminal with the timing based on the input data map 31, the joint data map 35, the open circuit input data map 36 and the second input data map 32, which are memorized in the memorizing section 22.

The controlling section 23 controls the input/output selector circuit 11 so that the comparator 11c judges whether the potential of each terminal is higher or lower than the standard potential, with at least part of the timings at which the inputting is carried out to the terminal.

For example, when the inputting is carried out to the "0001" terminal on the basis of the input data map 31, in a period of time from the start of the inspection, i.e. the inputting to the "0001" terminal, up to a lapse of time t after the start of the inspection, whether the potential of the terminal "0001" is higher or lower than the standard potential is judged within a period of time R1 shown in FIG. 7A, that is, in a period of time from a lapse of time 0.5 t after the start of the inspection up to a lapse of time t after the start of the inspection.

When the inputting is carried out to the "0011" terminal on the basis of the input data map 31, in periods of time from the start of the inspection, i.e. the inputting to the "0011" terminal, up to a lapse of time t after the start of the inspection and time from a lapse of time 9t after the start of the inspection up to a lapse of time 10t after the start of the inspection, whether the potential of the terminal "0011" is higher or lower than the standard potential is judged within periods of time R2a and R2b shown in FIG. 7B, that is, in periods of time from a lapse of time 0.5 t after the start of the inspection up to a lapse of time t after the start of the inspection and time from a lapse of time 9.5 t after the start of the inspection up to a lapse of time 10 t after the start of the inspection, respectively.

That is, in the present preferred embodiment, whether the potential of each terminal is higher or lower than the standard potential is judged with the timing of the last half out of the timings, at which the inputting is carried out to the terminal. Then, the data with respect to high or low of the potential of each terminal, which is controlled by the controlling section 23 and judged by the comparator 11c, is tentatively memorized by the memorizing section 22.

The judging section 24 compares the standard map 34 with the output data map 41 and judges that the wireharness 2 has no abnormality if there is no discrepancy between these maps 34 and 41. On the other hand, if there is a discrepancy between these maps 34 and 41, the judging section 24 samples a terminal with the discrepancy as a terminal that likely has an abnormality.

The judging section 24 compares the joint data map 35 with the second output data map 42 and judges that the wireharness 2 has no abnormality if there is no discrepancy between these maps 35 and 42. On the other hand, if there is a discrepancy between these maps 35 and 42, the judging section 24 samples a terminal with the discrepancy as a terminal that likely has an abnormality.

The judging section 24 compares the joint data map 35 with the third output data map 43 and judges that the wireharness 2 has no abnormality if there is no discrepancy between these maps 35 and 43. On the other hand, if there is a discrepancy between these maps 35 and 43, the judging section 24 samples a terminal with the discrepancy as a terminal that likely has an abnormality.

The judging section 24 compares the normal output data map 37 with the fourth output data maps 44a, 44b and 44c and judges that the wireharness 2 has no abnormality if there is no discrepancy between these maps 37 and 44a, 44b and 44c. On the other hand, if there is a discrepancy between these maps 35 and 44a, 44b and 44c, the judging section 24 samples a terminal with the discrepancy as a terminal that likely has an abnormality and also outputs a condition of the abnormality (short circuit or open circuit) to the displaying section 21.

The operating section 25 has operation buttons and so on for carrying out various operational directions and settings with respect to the wireharness inspection device 1.

In the following, the contents of the control program for controlling the operation of the controlling section 23, which is memorized in the memorizing section 22, will be explained with reference to flow charts shown in FIGS. 2 to 5.

When the quality of the wireharness 2 is judged by using the wireharness inspection device 1 according to the present preferred embodiment, the connector 5 of the wireharness 2 is connected to the interface connector 10 with each other. An operator operates operation buttons and so on of the operating section 25 and starts the operation of the wireharness inspection device 1. Then, the system advances to a matrix inspection step as a first inspection step shown as a step S1 in FIG. 2.

Figure 3:
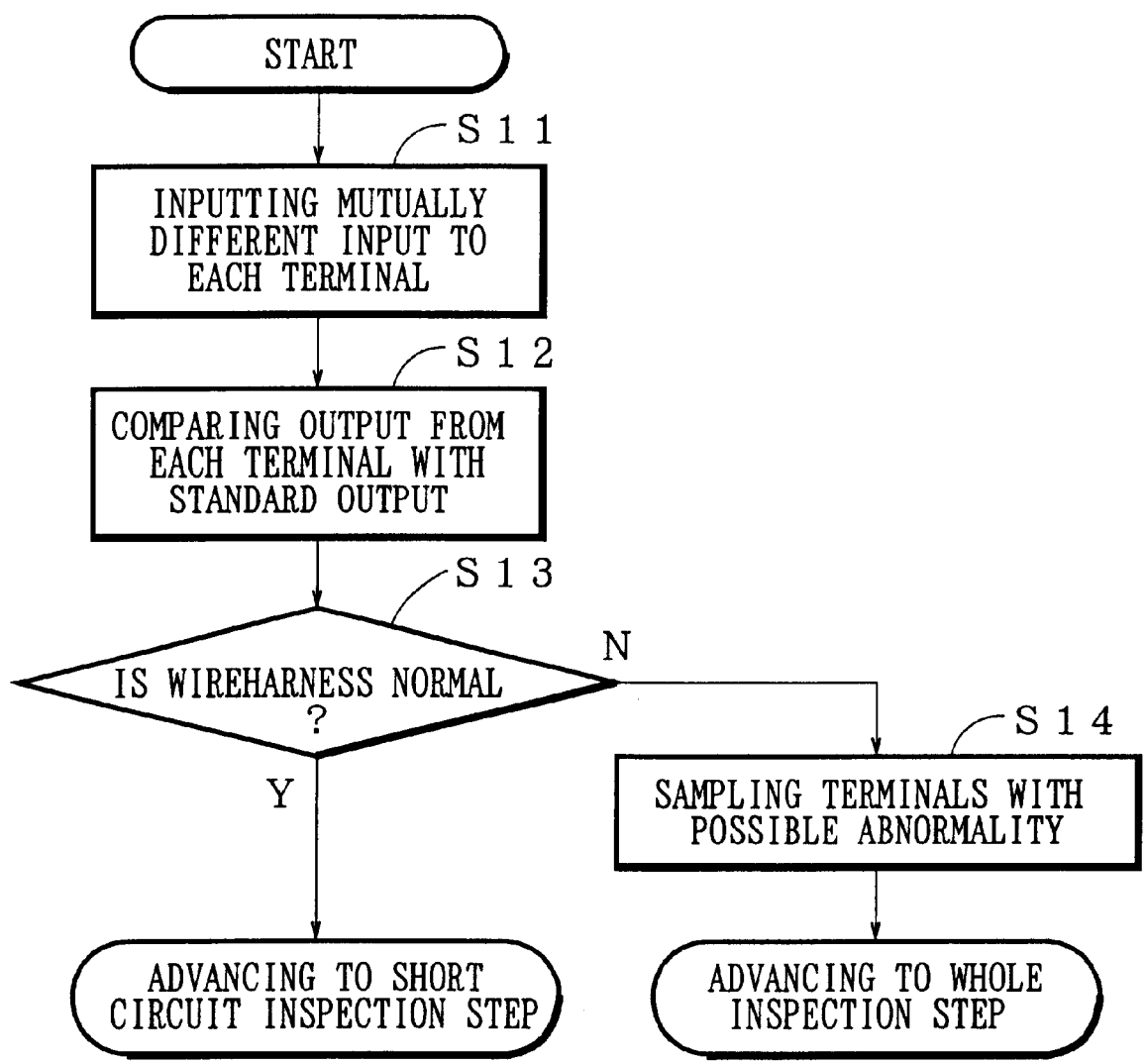
FIG. 3 is a flowchart illustrating matrix inspection steps in a method for inspecting the wireharness shown in FIG. 2.

At the matrix inspection step S1, first of all, at a step S11 in FIG. 3, each terminal is input the input with the timing based on the input data map 31, then the system advances to a step S12. At this time, since the inputting is simultaneously carried out to the "0001" terminal and "0011" terminal, for example, that is, the input is input to these terminals approximately simultaneously.

At the step S12, the judging section 24 compares the output data map 41, which is obtained when each terminal is input with the timing based on the input data map 31, with the standard map 34, then the system advances to a step S13.

Figure 2:
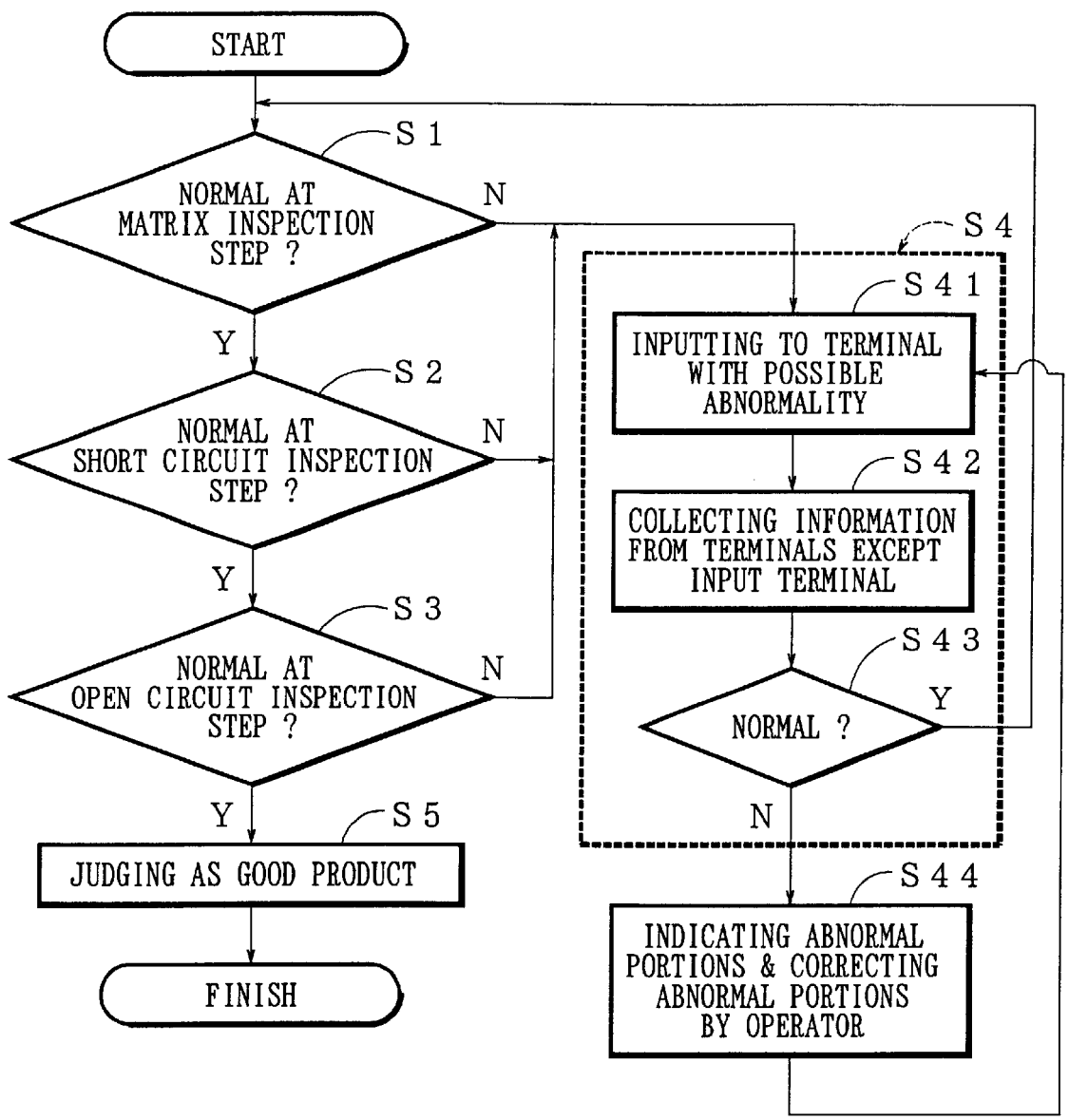
FIG. 2 is a flowchart illustrating a method for inspecting a wireharness, which is memorized by a memory section of the wireharness inspection device according to the embodiment.

At the step S13, if the judging section 24 judges that there is no discrepancy between the maps 34 and 41 at the step S12, i.e. that the wireharness 2 has no abnormality, the system advances to a short circuit inspection step as a second inspection step shown as a step S2 in FIG. 2.

On the other hand, if the judging section 24 judges that there is a discrepancy between the maps 34 and 41 at the step S12, i.e. that the wireharness 2 has an abnormality, the system advances to a step S14. At the step S14, a terminal causing the discrepancy is sampled as a terminal that likely has an abnormality and tentatively memorized in the memorizing section 22, then the system advances to a whole inspection step as a fourth inspection step shown as a step S4 in FIG. 2.

Figure 4:
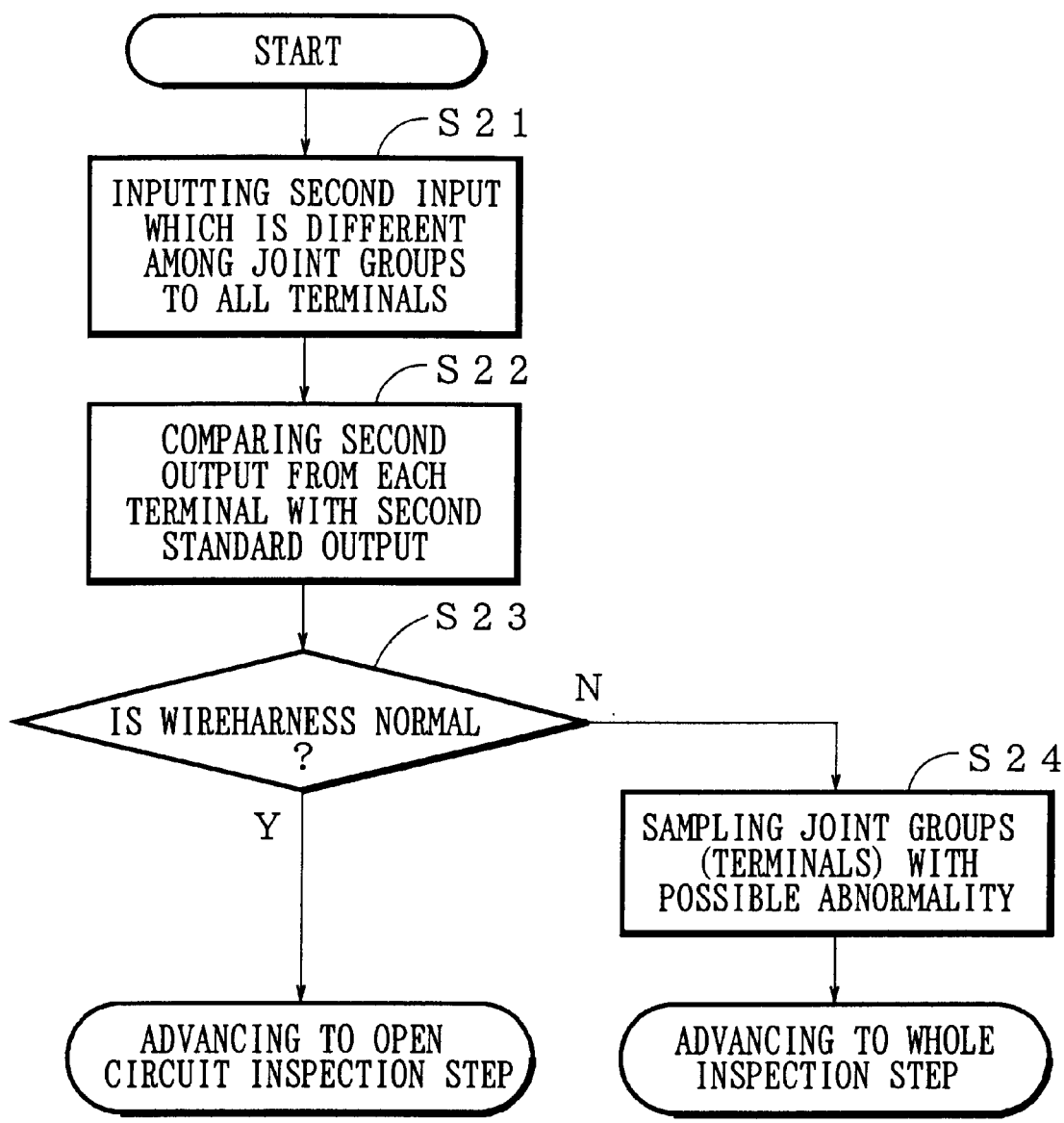
FIG. 4 is a flowchart illustrating short circuit inspection steps in a method for inspecting the wireharness shown in FIG. 2.

At the short circuit inspection step S2, at a step S21 in FIG. 4 each terminal is input with the timing based on the joint data map 35, then the system advances to a step S22. At this time, since the inputting is simultaneously carried out to terminals constituting the joint group JG1 and terminals constituting the joint group JG3, for example, that is, the input is input to these terminals approximately simultaneously.

At the step S22, the judging section 24 compares the second output data map 42, which is obtained when each terminal is input with the timing based on the joint data map 35, with the joint data map 35, then the system advances to a step S23.

At the step 23, if the judging section 24 judges that there is no discrepancy between the maps 35 and 42, i.e. that the wireharness 2 has no abnormality, the system advances to an open circuit inspection step as a third inspection step shown as a step S3 in FIG. 2.

On the other hand, if the judging section 24 judges that there is a discrepancy between the maps 35 and 42 at the step S23, i.e. that the wireharness 2 has an abnormality, the system advances to a step S24. At the step S24, a terminal causing the discrepancy is sampled as a terminal that likely has an abnormality and tentatively memorized in the memorizing section 22, then the system advances to the whole inspection step S4 in FIG. 2.

At the open circuit inspection step S3, at a step S31 shown in FIG. 5 each terminal is input with the timing based on an open circuit input data map 36, then the system advances to a step S32. At this time, since the inputting is simultaneously carried out to the "0001" terminal of the joint group JG1 and the "0012" terminal of the joint group JG3, for example, that is, the input is input to these terminals approximately simultaneously.

At the step S32, the judging section 24 compares the third output data map 43, which is obtained when each terminal is input with the timing based on the open circuit input data map 36, with the joint data map 35, then the system advances to a step S33.

At the step 33, if the judging section 24 judges that there is no discrepancy between the maps 35 and 43 at the step S23, i.e. that the wireharness 2 has no abnormality, the wireharness 2 is judged as a good product at a step S5.

On the other hand, if the judging section 24 judges that there is a discrepancy between the maps 35 and 43 at the step S33, i.e. that the wireharness 2 has an abnormality, the system advances to a step S34. At the step S34, a terminal causing the discrepancy is sampled as a terminal that likely has an abnormality and tentatively memorized in the memorizing section 22, then the system advances to the whole inspection step S4 in FIG. 2.

At the whole inspection step S4, at a step S41 shown in FIG. 2 the inputting is carried out only with respect to terminals that are sampled because of having abnormality at the matrix inspection step S1, the short circuit inspection step S2 and the open circuit inspection step S3, with the timing based on the second input data map 31, then the system advances to the step S42.

At the step S42, the high or low of the potential for all terminals is judged, then the fourth output data maps 44a, 44*b* and 44*c* shown in FIGS. 16, 18 and 20 are made and then, the system advances to a step S43. At the step S43, the fourth output data maps 44*a*, 44*b* and 44*c* are compared with the normal output data map 37, then if there is some discrepancy between them, the wireharness is judged to have an abnormality, then the system advances to a step S44.

At the step S43, the fourth output data maps 44*a*, 44*b* and 44*c* are compared with the normal output data map 37, then if there is no discrepancy between them, the wireharness 2 is judged to be a good product, then the system returns to the step S1.

At the step S44, portions of the discrepancy between the maps 44*a*, 44*b* and 44*c* and map 37, that is, the abnormal portions are displayed at the displaying section 21. Concretely, short circuit portions among the joint groups of the wireharness 2 and open circuit portions in each joint group are displayed at the displaying section 21.

At the step S44, an operator corrects the abnormal portions displayed at the displaying section 21. When the operator finishes the correction, the system returns to the step S41. When all the abnormal portions are corrected, the system returns to the step S41 from the step S43, then the matrix inspection step S1, the short circuit inspection step S2 and the open circuit inspection step S3 are performed in sequence.

According to the wireharness inspection device 1 of the present embodiment, each terminal is approximately simultaneously input on the basis of the input data map 31 shown in FIG. 6, then the output data map 41, which shows the potential of each terminal, is compared with the standard map 34 and then, the quality of the wireharness 2 is judged.

In the input data map 31 according to the present embodiment, the inputting is carried out to the terminals in sequence starting from the terminal, of which terminal number is shown by using the decimal notation, having less number of place up to the terminal having larger number of place, while with respect to each place the inputting is carried out to the terminals with the timing corresponding to the number of the place.

Therefore, the inputting is securely carried out to each terminal approximately simultaneously and a period of time required to complete the inputting to all the terminals can be shortened. Consequently, a period of time required to inspect the wireharness 2 can be shortened and a period of time required to manufacture the wireharness 2 also can be shortened.

Since the inputting is carried out to each terminal with the timing based on the input data map 31, i.e. with mutually different timings among the terminals, the quality of the wireharness 2 can be securely judged by comparing the standard map 34, which shows the potential of each terminal when the wireharness is normal, with the output data map 41, which shows the potential of actual terminals when the inputting is carried out to the terminals with the timing based on the input data map 31.

Moreover, since the inptting is carried out to each terminal with the timing based on the input data map 31, a period of time required for inputting the input does not fluctuate, because the time does not depend upon the number of joint groups, which constitute the wireharness 2.

For example, at the matrix inspection step S1, when the joint group JG1 of the wireharness 2 according to the present embodiment and the wire 4 connected to the "0007" terminal are in a short-circuit condition with each other, the output data map 41 shown in FIG. 15 is obtained. The abnormality of the "0001" terminal, "0002" terminal, "0005" terminal and "0007" terminal shown with diagonal lines in FIG. 15, in which the output data map 41 has a discrepancy with respect to the standard map 34, is securely found out.

At the matrix inspection step S1, when the wireharness 2 is judged to have no abnormality, at the short circuit inspection step S2 the inputting is carried out with the timing based on the joint data map 35, which is mutually different among the different joint groups but is the same within each joint group. Therefore, at this short circuit inspection step S2, a short circuit among the joint groups can be securely detected.

At the short circuit inspection step S2 a short circuit among the joint groups, which cannot be detected at the matrix inspection step S1 due to the electrical continuity of the terminals constituting the joint group, can be securely detected.

For example, in the wireharness 2 according to the present embodiment, when the joint group JG2 and the joint group JG3 are in a short circuit condition with each other, since there is provided no difference in the timing and the potential for inputting to the terminals, which constitute the joint group JG2 or the joint group JG3, in the input data map 31 and the standard map 34, therefore whether the joint group JG2 and the joint group JG3 are in a short circuit condition with each other or not cannot be judged at the matrix inspection step S1.

At the short circuit inspection step S2, when the joint group JG2 and the joint group JG3 are in a short circuit condition with each other, for example, the second output data map 42 shown in FIG. 17 can be obtained. The abnormality of the "0011" terminal and "0022" terminal shown with diagonal lines in FIG. 16, in which the second output data map 42 has a discrepancy with respect to the joint data map 35, that is, the abnormality of the joint group JG2, is securely found out.

When no abnormality is judged at the matrix inspection step S1 and the short circuit inspection step S2, the inputting is carried out to one terminal out of the terminals, which are different among the joint groups and constitute the same joint group, on the basis of the open circuit input data map 36 at the open circuit inspection step S3.

Therefore, at the open circuit inspection step S3, an open circuit between terminals constituting each joint group can be securely detected. At the open circuit inspection step S3, an open circuit between terminals of each joint group, which cannot be detected at the short circuit inspection step S2, can be securely detected.

For example, in the wireharness 2 according to the present embodiment, when the "0012" terminal and "0022" terminal, which constitute the joint group JG3, are in an open circuit condition with each other, since the joint data map 35 simultaneously inputs to all the terminals, which constitute the joint group JG3, whether the "0012" terminal and "0022" terminal are in an open circuit condition with each other or not cannot be judged at the short circuit inspection step S2.

At the open circuit inspection step S3, when when the "0012" terminal and "0022" terminal of the joint group JG3 are in an open circuit condition with each other, for example, the third output data map 43 shown in FIG. 19 is obtained. The abnormality of the "0021" terminal shown with diagonal lines in FIG. 19, in which the third output data map 43 has a discrepancy with respect to the joint data map 35, that is, the abnormality of the joint group JG3, is securely found out.

After an abnormality is judged at any one step out of the steps S1, S2 and S3, the inputting is carried out only to a terminal that likely has an abnormality at the whole inspection step S4, then the fourth output data maps 44a, 44b and 44c are compared with the normal output data map 37, therefore the abnormal portions (portions of short circuit and open circuit) of the wireharness 2 can be securely specified.

Thus, according to the method of inspecting of the wireharness inspection device 1 of the present embodiment, the inputting is simultaneously carried out to terminals at the matrix inspection step S1, a short circuit among the joint groups is inspected at the short circuit inspection step S2, and an open circuit among terminals within each joint group is inspected at the open circuit inspection step S3.

Therefore, a period of time required to input the input to terminals can be remarkably shortened compared to a method, in which the inputting is carried out to each terminal in sequence and (the total number of the terminals minus one) times of the inputting is necessary. Consequently, a period of time required to inspect the wireharness 2 can be shortened and a period of time required to manufacture the wireharness 2 also can be shortened.

In the wireharness inspection device 1 according to the preferred embodiment described above, the normal connection data are memorized in the memorizing section 22 in advance. Instead, the normal connection data may be set to be suitably altered through a various driving device of a recording medium such as a known floppy disk drive, which is connected to the control device 12.

Likewise, the normal connection data and so on may be set to be suitably altered by using a known keyboard or a mouse as the operating section 25.

The aforementioned preferred embodiments are described to aid in understanding the present invention and variations may be made by one skilled in the art without departing from the spirit and scope of the present invention.

According to the wireharness inspection device 1 described in the preferred embodiments, wireharness inspection devices constructed as described hereinafter can be obtained.

(Additional Remark 1)

A wireharness inspection device for judging the quality of a wireharness, which includes a plurality of wires and connectors for receiving terminals attached to ends of the wires, the device comprising:

inputting means for simultaneously inputting a mutually different input to said each terminal;

collecting means for collecting an output from said each terminal upon inputting of said input;

memorizing means for memorizing a standard output from each terminal upon inputting of said input when the wireharness is normal; and judging means for judging the quality of the wireharness by comparing the output with the standard output.

(Additional Remark 2)

The wireharness inspection device according to the Additional Remark 1, wherein said each terminal is numbered in sequence starting from one and said input is input to said each terminal with time intervals corresponding to said number.

(Additional Remark 3)

The wireharness inspection device according to the Additional Remark 2, wherein said input is input to said terminals in sequence starting from the terminal having less number of place up to the terminal having larger number of place, while with respect to each place said input is input to said terminals with the timing corresponding to the number of said place.

(Additional Remark 4)

The wireharness inspection device as described in any one of the Additional Remarks 1 to 3, wherein the wireharness has joint groups, each joint group having the wires mutually electrically connected and terminals connected to ends of the wires, the inputting means simultaneously inputs a second input, which is mutually different among the different joint groups but is identical within said each joint group, to said each terminal, the collecting means collects the second output from said each terminal after inputting of said second input, the memorizing means memorizes a second standard output from each terminal upon inputting of said second input when the wireharness is normal, and the judging means judges the quality of the wireharness by comparing the second output with the second standard output.

(Additional Remark 5)

The wireharness inspection device as described in any one of the Additional Remarks 1 to 3, wherein the wireharness has joint groups, each joint group having the wires mutually electrically connected and terminals connected to ends of the wires, the inputting means simultaneously inputs a third input, which is mutually different among the different joint groups, to any one of terminal out of the terminals constituting the respective joint group, the collecting means collects a third output from said each terminal after inputting of said third input, the memorizing means memorizes a third standard output from each terminal upon inputting of said third input when the wireharness is normal, and the judging means judges the quality of the wireharness by comparing the third output with the third standard output.

(Additional Remark 6)

A wireharness inspection device for judging the quality of a wireharness, which includes a plurality of wires and connectors for receiving terminals attached to ends of the wires, the wireharness having joint groups, each joint group having the wires mutually electrically connected and terminals connected to ends of the wires, and the device comprising:

inputting means for inputting an input to said each terminal, collecting means for collecting an output from said each terminal upon inputting the input, memorizing means for memorizing information of normal connection indicating connecting conditions among said wires of a normal wireharness, and judging means for judging the quality of the wireharness on the basis of the output and the information of normal connection, wherein a second inspection step is performed, in which the inputting means simultaneously inputs a second input, which is mutually different among the different joint groups but is identical within said each joint group, to said each terminal, the collecting means collects a second output from said each terminal after inputting the second input, the memorizing means memorizes a second standard output from said each terminal upon inputting of the second input when the wireharness is normal, and the judging means judges the quality of the wireharness by comparing the second output with the second standard output, and a third inspection step is performed, in which the inputting means simultaneously inputs a third input, which is mutually different among the different joint groups, to any one of terminal out of the terminals constituting the respective joint group, the collecting means collects a third output from said each terminal after inputting the third input, the memorizing means memorizes a third standard output from said each terminal upon inputting of the third input when the wireharness is normal, and the judging means judges the quality of the wireharness by comparing the third output with the third standard output.

(Additional Remark 7)

The wireharness inspection device according to the Additional Remark 1, 2, 3 or 6, wherein said each joint group is numbered in sequence starting from one and said input is input to said each terminal with the timing corresponding to the number of said each joint group.

(Additional Remark 8)

The wireharness inspection device according to the Additional Remark 1, 2, 3 or 6, wherein said each joint group is numbered in sequence starting from one and said input is input to said each terminal with the timing corresponding to the number of said each joint group.

(Additional Remark 9)

The wireharness inspection device according to the Additional Remark 1, 2, 3 or 6, when the judging means judges that the wireharness has abnormality on the basis of an output from at least one terminal in any one step out of the first to third inspection steps, the inputting means successively selects one terminal out of said terminals being judged to have abnormality and inputs a fourth input to said selected terminal, the collecting means collects fourth outputs from all terminals except said selected terminal, the memorizing means memorizes fourth standard outputs from all terminals except said selected terminal upon inputting of said fourth input to said selected terminal when the wireharness is normal, and the judging means judges the quality of the wireharness by comparing the fourth outputs with the fourth standard outputs.

According to the wireharness inspection device described in any one of Additional Remarks 1 to 9, a period of time required to inspect the wireharness can be shortened.

What is claimed is:

1. A method for inspecting a wire harness including a plurality of wires and connectors for receiving terminals attached to ends of the wires in order to judge the quality of the wire harness, the method comprising a first inspection step consisting of:

simultaneously inputting a unique input to said each terminal; and judging the quality of the wire harness by comparing an output from said each terminal upon inputting of said input with a standard output from each terminal of a normal wire harness upon inputting of said input.

2. The method for inspecting a wireharness according to claim 1, wherein said each terminal is numbered in sequence starting from one and said input is input to said each terminal with time intervals corresponding to said number.

3. The method for inspecting a wireharness according to claim 2, wherein said input is input to said terminals in sequence starting from the terminal having less number of place up to the terminal having larger number of place, while with respect to each place said input is input to said terminals with the timing corresponding to the number of said place.

4. The method for inspecting a wire harness as claimed in any one of claims 1 to 3, wherein the wire harness has joint groups, each joint group having the wires commonly electrically connected and terminals connected to ends of the wires, and the method comprising a second inspection step consisting of:

simultaneously inputting a second input, which is unique among the different joint groups but is identical within said each joint group, to said each terminal; and judging the quality of the wire harness by comparing a second output from said each terminal after inputting of said second input with a second standard output from each terminal of a normal wire harness upon inputting of said second input.

5. The method for inspecting a wire harness as claimed in any one of claims 1 to 3, wherein the wire harness has joint groups, each joint group having the wires commonly electrically connected and terminals connected to ends of the wires, and the method comprising a third inspection step consisting of:

simultaneously inputting a third input, which is unique among the different joint groups, to any one terminal out of the terminals consisting of the respective joint groups; and judging the quality of the wire harness by comparing a third output from said each terminal after inputting of said third input with a third standard output from each terminal of a normal wire harness upon inputting of said third input.

6. A method for inspecting a wire harness which includes a plurality of wires and connectors for receiving terminals attached to ends of the wires in order to judge the quality of the wire harness, wherein the wire harness has joint groups, each joint group having the wires commonly electrically connected and terminals connected to ends of the wires, and the method comprising a second inspection step and a third inspection step, said second inspection step comprising the steps of:
      simultaneously inputting a second input, which is unique among the different joint groups but is identical within said each joint group to said each terminal; and
      judging the quality of the wire harness by comparing a second output from said each terminal after inputting of said second input with a second standard output from each terminal of a normal wire harness upon inputting of said second input, said third inspection step comprising the steps of:
      simultaneously inputting a third input, which is unique among the different joint groups, to any one terminal out of the terminals constituting the respective joint groups; and
      judging the quality of the wire harness by comparing a third output from said each terminal after inputting of said third input with a third standard output from each terminal of a normal wire harness upon inputting of said third input.

7. The method for inspecting a wireharness according to claim 1, 2, 3 or 6, wherein said each joint group is numbered in sequence starting from one and said second input is input to said each terminal with the timing corresponding to the number of said each joint group.

8. The method for inspecting a wireharness according to claim 1, 2, 3 or 6, wherein said each joint group is numbered in sequence starting from one and said third input is input to said each terminal with the timing corresponding to the number of said each joint group.

9. The method for inspecting a wireharness according to claim 1, 2, 3 or 6, when the wireharness is judged to have abnormality on the basis of an output from at least one terminal in any one step out of the first to third inspection steps, the method comprising a fourth inspection step consisting of:

successively selecting one terminal out of said terminals being judged to have abnormality;

inputting a fourth input to said selected terminal; and judging the quality of the wireharness by comparing fourth outputs from all terminals except said selected terminal with fourth standard outputs from all terminals except said selected terminal upon inputting of said fourth input to said selected terminal of a normal wireharness.

* * * * *